(12) United States Patent
Yu

(10) Patent No.: US 6,995,095 B2
(45) Date of Patent: Feb. 7, 2006

(54) METHODS OF SIMULTANEOUSLY FABRICATING ISOLATION STRUCTURES HAVING VARYING DIMENSIONS

(75) Inventor: Hsu-Sheng Yu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 144 days.

(21) Appl. No.: 10/683,305

(22) Filed: Oct. 10, 2003

(65) Prior Publication Data

US 2005/0079722 A1    Apr. 14, 2005

(51) Int. Cl.
*H01L 21/302*    (2006.01)

(52) U.S. Cl. .................. 438/750; 438/296; 438/424; 438/427; 438/694; 438/700; 438/725; 438/734

(58) Field of Classification Search ............. 438/296, 438/424, 427, 694, 700, 725, 734, 750; 257/506
See application file for complete search history.

(56) References Cited

U.S. PATENT DOCUMENTS 6,596,608 B2 *  7/2003  Saito .......................... 438/424
6,720,217 B2 *  4/2004  Kim et al. ................... 438/257
6,849,919 B2 *  2/2005  Sumino et al. .............. 257/510
2005/0106871 A1 *  5/2005  Yu .............................. 438/689

FOREIGN PATENT DOCUMENTS

KR        2002-050468    *  6/2002

* cited by examiner

Primary Examiner—George A. Goudreau
(74) Attorney, Agent, or Firm—Stout, Uxa, Buyan & Mullins, LLP

(57) ABSTRACT

Shallow trench isolation structures are simultaneously fabricated such that ones in a cell region have first-type features and others in a periphery region have second-type features. The first-type features can be rounded edges or can be first depths and widths, and the second-type features can be unrounded edges or can be second depths and widths which are different from the first depths and widths. The method includes forming patterned photoresist over a hard mask over portions of a cell and a periphery region, and removing the exposed hard mask layer in the periphery region while removing a portion of the exposed hard mask layer in the cell region. A trench is then partially formed in the periphery region and more of the hard mask layer is removed in the cell region, followed by the trench in the periphery region being deepened while a trench in the cell region is formed.

23 Claims, 4 Drawing Sheets

METHODS OF SIMULTANEOUSLY FABRICATING ISOLATION STRUCTURES HAVING VARYING DIMENSIONS

BACKGROUND OF THE INVENTION

1. Field of the Invention

The present invention relates generally to semiconductor fabrication methods and, more particularly, to a method for generally simultaneously fabricating a plurality of shallow trench isolation structures such that some selected ones of the shallow trench isolation structures have first-type features and other selected ones of the shallow trench isolation structures have second-type features.

2. Description of Related Art

Integrated circuits are well known. Integrated circuits are commonly used to make a wide variety of electronic devices, such as memory chips. There is a strong desire to reduce the size of integrated circuits, so as to increase the density of the individual components thereof and consequently enhance the functionality of an integrated circuit.

For example, there is a strong desire to reduce the size of the integrated circuits used to make memory chips. By reducing the size of the integrated circuits, each memory chip can have more capacity and thus be more functional.

However, the greater semiconductor component densities which result from such miniaturization inherently result in an increased potential for undesirable electrical interactions between nearby components.

For example, undesirable parasitic inter-device currents tend to be accentuated as semiconductor component densities increase. Such parasitic inter-device currents can occur when carriers, such as either electrons or electron holes, drift between adjacent active devices on a semiconductor substrate. Such drifting of carriers becomes more pronounced as the distance between active devices decreases.

Thus, in the fabrication of integrated circuits, it is frequently necessary to isolate the semiconductor components from one another, so as to mitigate the potential for such undesirable electrical interactions.

A widely used technology for isolating adjacent metal oxide semiconductor (MOS) circuits involves the local oxidation of silicon (LOCOS), in which unmasked non-active or field regions of the silicon substrate are exposed to a heated oxidizing atmosphere to thereby grow recessed or semi-recessed silicon dioxide (e.g., field oxide) areas. The silicon dioxide on the unmasked regions is generally grown thick enough to lower any parasitic capacitance which may occur over the regions of interest, but not so thick as to cause step coverage problems. As distinguished from non-active regions, regions of the substrate that are to be fabricated as active regions are protected by masking to facilitate the subsequent formation of active devices in the active regions.

However, LOCOS isolation applications are not without limitations. For example, a commonly recognized limitation is that of oxide undergrowth at the edge of the mask, wherein the silicon dioxide being grown intrudes laterally under the edge of the mask and encroaches into the active regions of the substrate. This phenomenon, which is commonly known as "bird's beak," can adversely affect device performance, reduce the area in which active devices can be built, and create stress in the substrate, while not appreciably contributing to device isolation. Moreover, as the oxide grows under the mask, the mask layer is undesirably pushed up forming a non-planar oxide defect. This non-planar defect stems, in part, from the fact that the thermally grown oxide can have approximately twice the thickness of the silicon consumed in the thermal oxidation process. Resulting non-planar formations can present problems with, for example, subsequent layer conformity and photolithography.

Recognizing the shortcomings of LOCOS isolation implementations, contemporary complimentary metal oxide semiconductor (CMOS) constructions have increasingly utilized trenches, and in particular shallow trench isolation (STI) structures, between active regions. Shallow trench isolation structure formation typically entails using a mask to define and pattern a shallow trench on a substrate using anisotropic etching processes, and then filling the shallow trench with an insulating material, followed by a subsequent step wherein the insulating material is planarized back to define the shallow trench isolation. Shallow trench isolation structures can attenuate or eliminate the "bird beak" problem of oxide intrusion into active areas, thus allowing for greater operability and smaller isolation element spacing.

Regarding shallow trench isolation structures, it may in some circumstances be desirable to form them to have different dimensions (e.g., sizes and shapes) at different locations on a substrate. In a memory device, for example, the operation voltage in a periphery region is typically higher than the operation voltage in a cell region. Therefore, if may be desirable to form shallow trench isolation structures in the periphery region to be deeper and larger than shallow trench isolation structures in the cell region.

Shallow trench isolation structures typically comprise abruptly-shaped sides and corners, as a result of, for example, the anisotropic etching methods which are used to form the trench isolations. These abrupt geometries may lead to undesirable electrical characteristics, such as "edge conduction" wherein excessive current leakage occurs in the upper region between the top of an isolation trench and an adjacent active device. An active device disposed in close proximity to a small-radius edge or corner of an isolation trench may exhibit, for example, a relatively high edge conduction including undesirable parasitic leakage paths. Such undesirable effects as the well known double hump of the characteristic I-V curve (see U.S. Pat. No. 6,074,931) of an active device can result.

Additionally, the sharp corners of the shallow trench isolation can also lead to difficulties in depositing the trench with dielectric filler material during subsequent processing. For example, sharp corners at the upper opening of the trench can lead to a pinching-off of that opening of the trench during dielectric deposition before the trench is completely filled, leaving an undesirable void in the trench filling. As the trend continues for component miniaturization and device density, it becomes more and more desirable to form narrower deep trench isolations having larger aspect ratios. The problem of void formation, however, can be exacerbated as the aspect ratio of the trench isolation is increased.

For example, as isolation trenches are formed with greater aspect ratios, it becomes increasingly probable that, during the filling of the isolation trench with silicon dioxide, narrowing of the opening at the mouth of the trench from the formation of the silicon dioxide will impede proper and complete filling of the trench resulting in the formation of voids.

Rounding of the corners or edges of a shallow trench isolation structure tends to mitigate at least some of the aforementioned problems associated with sharp corners thereof. However, although it is desirable to round the corners of a shallow trench isolation structure in some instances, in other instances it may not be possible, practical, or desirable to do so.

For example, in memory devices the critical dimension, i.e., the width, of the shallow trench isolation structures in the cell region is typically smaller than the critical dimension of the shallow trench isolation structures in the periphery region. Although it may be desirable to round the corners of the shallow trench isolation structures in the periphery region of the memory device to mitigate the double hump in the characteristic I-V curve thereof, this cannot be accomplished while maintaining the relatively small critical dimension of the shallow trench isolation structures in the cell region.

In this instance, corner rounding can necessitate an unacceptable reduction in the critical dimension of the shallow trench isolation structures in the cell region. Further, as discussed above, it can be relatively difficult to properly fill a shallow trench isolation structure having such a reduced critical dimension with insulating material. Thus, in this instance, it is necessary or desirable to leave the shallow trench isolation structures of the cell region unrounded.

However, it is still desirable to round the corners of the shallow trench isolation structures in the periphery of the memory device for the aforementioned reasons. Thus, it is desirable to form an integrated circuit such that some of the shallow trench isolation structures thereof have rounded corners and others of the shallow trench isolation structures thereof have unrounded corners. Of course, forming the shallow trench isolation structures having rounded corners using a different process from that used to form the shallow trench isolation structures having unrounded corners would be undesirably inefficient, costly, and likely to adversely affect yield.

A need thus exists in the prior art for methods of simultaneously forming shallow trench isolation structures having varying dimensions, such as varying sizes and shapes, in accordance with their respective locations on a substrate.

SUMMARY OF THE INVENTION

The present invention addresses these needs by providing methods for generally simultaneously fabricating a plurality of shallow trench isolation structures such that some selected ones of the shallow trench isolation structures have first-type features and other selected ones of the shallow trench isolation structures have second-type features. The shallow trench isolation structures having first-type features can be disposed in a periphery region and the shallow trench isolation structures having second-type features can be disposed in a cell region. The first-type features may comprise rounded edges and the second type features may comprise unrounded edges. In other embodiments, the first-type features may comprise depths and widths of first dimensions and the second type features may comprise depths and widths of second dimensions which are different than the first dimensions.

The invention herein disclosed, according to one aspect, comprises a method for forming shallow trench isolation structures, wherein the method comprises providing a substrate having a cell region and a periphery region, forming a hard mask upon the substrate so as to cover at least a portion of the cell region and at least a portion of the periphery region, forming a patterned photoresist layer upon the hard mask, the photoresist exposing a portion of the hard mask in the cell region and exposing a portion of the hard mask in the periphery region, performing a first etching process to remove the hard mask layer exposed by the photoresist layer in the periphery region and to remove a portion of the hard mask layer exposed by the photoresist layer in the cell region, performing a second etching process to partially form a trench in the periphery region and to remove more of the hard mask layer in the cell region, performing a third etching process to deepen the trench formed in the periphery region and to form a trench in the cell region, and filling the trench in the periphery region and filling the trench in the cell region with an insulating material. The trench that is partially formed in the second etching process can have having rounded corners which are maintained in the third etching process. In another aspect, after the third etching process the trench in the periphery region has widths and depths that are greater than corresponding widths and depths of the trench in the cell region.

According to another aspect, the present invention comprises a method for forming trenches for shallow trench isolation structures, wherein the method comprises etching a hard mask of a periphery region deeper than a hard mask of a cell region during a first etching process, etching the hard mask of the cell region further and etching the substrate of the periphery region so as to partially form a trench during a second etching process, and etching the substrate in the cell region so as to form a trench in the cell region and etching the substrate in the periphery region so as to deepen the trench formed therein during a third etching process. In one aspect of the invention, the trench which is partially formed in the second etching process can have rounded corners that are maintained in the subsequent etching process. In another aspect, the trench in the periphery region has widths and depths that are greater than corresponding widths and depths of the trench in the cell region.

According to another aspect, the present invention comprises method for forming trenches for shallow trench isolation structures, wherein the method comprises etching a hard mask of a periphery region approximately down to a pad oxide layer and etching a hard mask of a cell region less than down to a pad oxide layer so as to leave a remaining portion of the hard mask of the cell region during a first etching process, etching the remaining portion of the hard mask of the cell region approximately down to the pad oxide layer and etching the substrate of the periphery region during a second etching process, and etching the substrate in the cell region so as to form a trench therein and etching the substrate in the periphery region so as to deepen the trench formed therein during a third etching process. The trench that is formed in the second etching process can have rounded corners which are maintained in the following etching process. In another aspect, the etching of a hard mask of a periphery region approximately down to a pad oxide layer includes etching through the pad oxide layer and down to the substrate, and trench width and depth dimensions are greater in the periphery region than in the cell region.

According to another aspect, the present invention comprises a shallow trench isolation structure formed by a process of the present invention. According to another aspect, the present invention comprises an integrated circuit formed by a process of the present invention.

According to another aspect, the present invention comprises shallow trench isolation structures comprising a first trench formed in a peripheral region of a substrate, the first trench having first-type features such as rounded corners or large dimensions, and a second trench formed in a cell region of a substrate, the second trench having second-type features such as unrounded corners or relatively small dimensions.

According to another aspect, the present invention comprises an integrated circuit comprising a substrate, a first trench formed in a peripheral region of the substrate, the first trench having first-type features such as rounded corners or relatively large widths and depths, and a second trench formed in a cell region of a substrate, the second trench having second-type features such as unrounded corners or relatively small widths and depths.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
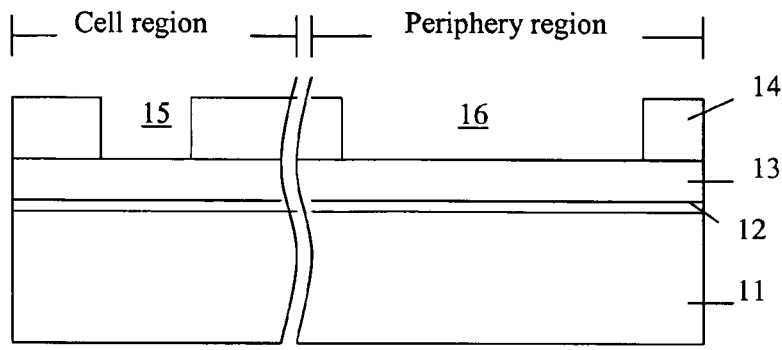
FIG. 1 is a cross-sectional view of a substrate having a pad oxide layer, a hard mask layer, and a photoresist layer formed upon cell and periphery regions thereof according to an exemplary embodiment of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims.

It is to be understood and appreciated that the process steps and structures described herein do not cover a complete process flow for the manufacture of shallow trench isolation structures. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a method for generally simultaneously fabricating a plurality of shallow trench isolation structures such that some selected ones of the shallow trench isolation structures have rounded corners and other selected ones of the isolation structures do not have rounded corners.

According to one aspect, the present invention comprises a method for forming shallow trench isolation structures wherein the method comprises generally simultaneously forming relatively small trenches or trenches without rounded corners in a cell region of a substrate and forming relatively large trenches or trenches with rounded corners in a periphery region of a substrate.

According to this aspect, the present invention comprises providing a substrate having a cell region and a periphery region. A hard mask is formed upon the substrate so as to cover at least a portion of the cell region and at least a portion of the periphery region. A patterned photoresist layer is formed upon the hard mask such that the photoresist exposes a portion of the hard mask in the cell region and similarly exposes a portion of the hard mask in the periphery region.

A first etching process is performed to remove the hard mask layer exposed by the photoresist layer in the periphery region and to remove a portion of the hard mask layer exposed by the photoresist layer in the cell region. A second etching process is performed to partially form a trench in the periphery region and to remove more of the hard mask layer in the cell region. A third etching process is performed to deepen the trench formed in the periphery region and to form a trench in the cell region.

The trench in the periphery region and the trench in the cell region are both filled with an insulating material, preferably during the same processing step. The photoresist is preferably removed after performing the third etching process. The hard mask is preferably removed after filling the trench with an insulating material. A pad oxide layer is preferably formed upon the substrate prior to forming the hard mask thereon. The pad oxide layer is preferably removed after removing the photoresist.

The performing of the first etching process preferably comprises removing substantially all of the hard mask layer exposed by the photoresist layer in the periphery region. The performing of the second etching process preferably comprises removing substantially all of the hard mask layer exposed by the photoresist layer in the cell region.

An etching gas of the first etching process preferably comprises $CF_4/CH_2F_2$ or $CF_4/CHF_3$. An etching gas of the second etching preferably process can comprise $CF_4/CHF_3$, or can comprise $HBr/CF_4/Cl_2/He$—$O_2$. An etching gas of the third etching process preferably comprises $Cl_2/O_2$.

The trench in the periphery region and the trench in the cell region are preferably filled with the same material. The trench in the periphery region and the trench in the cell region are preferably filled with a dielectric oxide, such as silicon dioxide. Those skilled in the art will appreciate that other dielectric materials are likewise suitable for filling the trenches.

Referring more particularly to the drawings, FIGS. 1–5 depict a preferred embodiment of the present invention, wherein shallow trench isolation structures having rounded corners or edges are formed generally simultaneously with shallow trench isolation structures having unrounded or generally square corners or edges.

Those skilled in the art will appreciate that although the structures 19 are depicted in the drawings as corners, these structures are actually edges along the uppers sides of the trenches. The terms corners and edges are thus generally used interchangeably herein.

Referring now to FIG. 1, a substrate 11 comprises a cell region and a periphery region as labeled in the drawing. The substrate 11 may comprise a silicon substrate such as those commonly used in the manufacture of integrated circuits such as memory devices. Alternatively, the substrate 11 may comprise any other desired material.

A pad oxide layer 12 can be formed upon the substrate 11. As those skilled in the art will appreciate, the pad oxide layer 12 mitigates stresses due to crystalline structure mismatch between the substrate 11 and a subsequently applied hard mask layer 13 according to well know principles.

According to the preferred embodiment of the present invention, a hard mask layer 13 can be formed upon the substrate 11, preferably upon the pad oxide layer 12. The hard mask layer 13 preferably comprises silicon nitride. However, as those skilled in the art will appreciate, the hard mask layer may alternatively comprises various other materials. The hard mask layer 13, in cooperation with a subsequently applied photoresist layer 14, provides a mask which determines which portions of the substrate will be etched, have materials deposited thereon, or be otherwise processed according to well known principles.

A patterned photoresist layer 14 can be formed upon the hard mask layer 13. The patterned photoresist layer 14 has openings 15 and 16 patterned therein to facilitate similar patterning of the hard mask 13, so as to subsequently facilitate etching of and material deposition upon underlying materials according to well known principles. Those skilled in the art will appreciate that various other methods for patterning the hard mask 13 are likewise suitable. For example, the hard mask 13 may alternatively be patterned via laser cutting or ion milling.

Some of the openings 15 formed in the photoresist layer 14 can be formed over the cell region of the substrate 11, so as to facilitate the formation of trenches having unrounded corners. As discussed above, it is sometimes desirable to form trenches having unrounded corners so as to better maintain the critical dimension thereof. This is particularly true when the trenches are being formed in a region which is densely populated with semiconductor devices, such that the critical dimension of the trenches must be maintained to avoid physical interference with the adjacent semiconductor devices.

Some of the openings 16 formed in the photoresist layer 14 can similarly be formed over the periphery region of the substrate 11, so as to facilitate the formation of trenches having rounded corners. As discussed above, it is sometimes desirable to form trenches having rounded corners so as to mitigate the double hump of the characteristic I-V curve of nearby semiconductor devices.

As shown in FIG. 1, the opening 15 in the photoresist 14 over the cell region is comparatively small with respect to the opening 16 formed in the photoresist 14 over the periphery region. The comparatively small opening 15 facilitates the formation of a shallow trench isolation structure having a comparatively small critical dimension in the cell region, while the comparatively large opening 16 facilitates the formation of a shallow trench isolation structure having a comparatively large critical dimension in the periphery region.

It is worthwhile to note that in the practice of the present invention, such as upon a wafer in a chemical vapor deposition (CVD) process, many such cell regions and many such periphery regions may exist in close proximity to one another.

Figure 2:
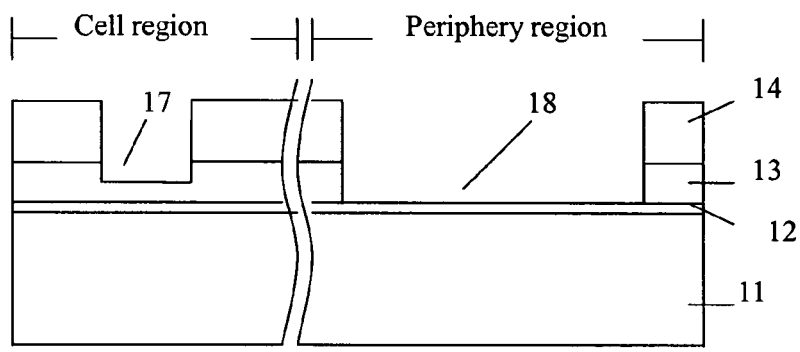
FIG. 2 is a cross-sectional view of the structure of FIG. 1 following removal of a portion of the exposed hard mask in the cell region and removal of substantially all of the exposed hard mask in the periphery region.

Referring now to FIG. 2, a first etching process is performed to partially remove a portion of the exposed hard mask 13 in the cell region to form an etched portion 17 therein and to substantially completely remove all of the exposed hard mask 13 in the periphery region to form an etched portion 18 therein. Thus, in the periphery region the hard mask 13 is preferably etched all of the way down to the pad oxide layer 12.

As those skilled in the art will appreciate, such removal of material to a selected depth may be facilitated by a variety of methodologies. For example, the hard mask 13 in the cell region may be treated so as to be thicker or otherwise more resistant to etching with respect to the hard mask 13 in the periphery region.

In etching processes, etching micro-loading effects can exist in different critical dimensions. General hard mask opening techniques may seek to reduce these effects with low polymer gas (e.g., $CF_4$, $CF_4/O_2$). In accordance with an aspect of the invention, high polymer gas (e.g., $CHF_3$, $CH_2F_2$) can be added to selectively enhance etching micro-loading effects. Using this approach, a larger hard mask can be achieved in the cell region while the hard mask of periphery region is fully etched.

An etching gas of the first etching process preferably comprises $CF_4/CH_2F_2$ or $CF_4/CHF_3$. The ratio of $CF_4$ to $CH_2F_2$ is preferably about 2 to about 5. The ratio of $CF_4$ to $CHF_3$ is preferably about 3 to about 5. Those skilled in the art will appreciate that other etching gases and other rations are likewise suitable.

Figure 3:
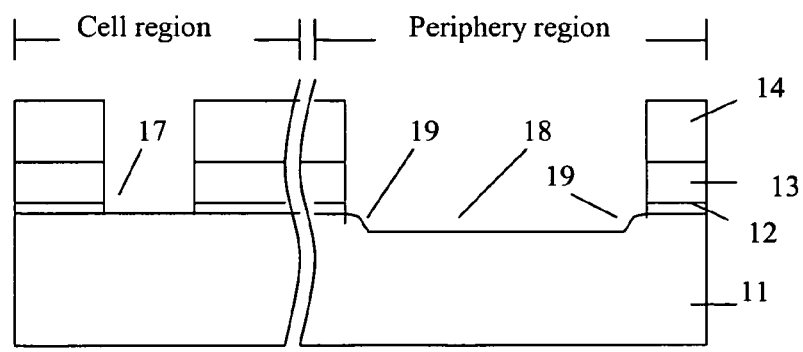
FIG. 3 is a cross-sectional view showing removal of the remainder of the exposed hard mask, as well as the pad oxide layer therebeneath, in the cell region and showing the beginning of the formation of a trench in the exposed substrate of the periphery region, wherein the trench has rounded corners.

Referring now to FIG. 3, a second etching process is performed to remove the remaining hard mask in the cell region and optionally to begin forming a trench in the cell region. Any trench which begins to be formed in the cell region has generally square or unrounded corners. At the same time, the second etching process begins forming a trench in the periphery region, such that the trench in the periphery region has rounded top corners 19. The round corners of the trench formed in the periphery region during the second etching process can have a radius between approximately 30 nm and approximately 60 nm and preferably have a radius of about 60 nm.

To generate corner rounding in the periphery region using for example $CF_4/CHF_3$ gas a heavy polymer forming near sidewall of the trench is implemented as the trench begins to form. Utilizing sidewall polymer deposition, the top rounding can naturally be formed.

Preferably, the etched portion 17 in the cell region extends through the pad oxide layer 13 and the etched portion 18 of the periphery region extends substantially into the substrate 11 after the second etching process.

An etching gas of the second etching process preferably comprises $CF_4/CHF_3$. The ratio of $CF_4$ to $CHF_3$ is preferably about 4 to about 6. Those skilled in the art will appreciate that other etching gases and other ratios are likewise suitable.

Figure 4:
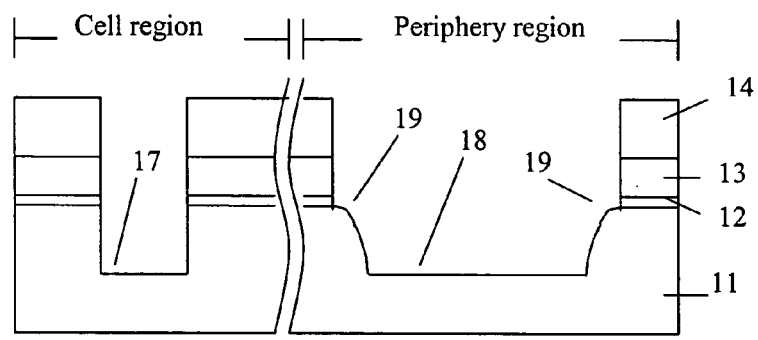
FIG. 4 is a cross-sectional view showing formation of a trench in the cell region of the substrate and showing completion of the formation of a trench in the substrate of the periphery region.

Referring now to FIG. 4, a third etching process is performed to form a trench 17 in the substrate 11 in the cell region thereof and to complete the trench 18 in the substrate 11 in the periphery region thereof. The corners of the trench 17 in the cell region remain substantially square or unrounded and the corners 19 of the trench 18 in the periphery region remain substantially rounded. The round corners of the trench formed in the periphery region during the third etch can have a radius between approximately 30 nm and approximately 60 nm and preferably have a radius of about 60 nm.

In the illustrated embodiment, the trench in the periphery region and the trench in the cell region can be formed so as to have approximately the same depth. However, the trench in the periphery region and the trench in the cell region may alternatively have different depths with respect to one another, such as for example in the embodiment discussed below with reference to FIGS. 6–9. An etching gas of the third etching process preferably comprises $Cl_2/O_2$. The ratio of $Cl_2$ to $O_2$ is preferably about 6 to about 12, and the etching gas plasma can contain 60–120 sccm $Cl_2$ and 5–12 sccm $O_2$. Those skilled in the art will appreciate that other etching gases may likewise be suitable.

Figure 5:
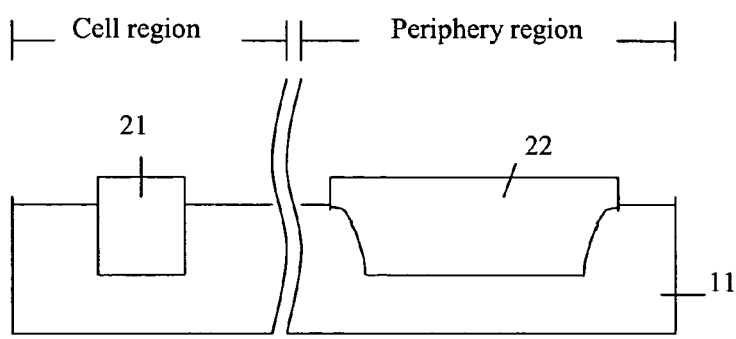
FIG. 5 is a cross-sectional view showing the trench of the cell region and the trench of the periphery region of FIG. 4 both filled with an insulating material.

Referring now to FIG. 5, the photoresist layer 14 is removed and an insulating material 21, 22, such as silicon dioxide, is deposited within the trenches 17, 18, so as to form shallow trench isolation structures.

After depositing the insulating material 21, 22 within the trenches 17, 18, the hard mask 14 and the optional pad oxide layer 12 are preferably removed.

The shallow trench isolation structure in the cell region has substantially square or unrounded corners, so as to maintain the critical dimension thereof (since for example rounded corners would tend to intrude undesirably upon adjacent active devices). The shallow trench isolation structure in the periphery region has substantially rounded corners 19, which tend to mitigate the double hump of the characteristic I-V curve of adjacent active devices.

The shallow trench isolation structures having square corners of the cell region and the shallow trench isolation structures having rounded corners of the periphery region are thus formed simultaneously, so as to mitigate the need for additional processing steps which would tend to undesirably decrease yield and increase costs.

Referring now to FIGS. 6–9, another preferred embodiment of the present invention is elucidated wherein shallow trench isolation structures having first-type features of first dimensions are formed generally simultaneously with shallow trench isolation structures having second-type features of second dimensions which are smaller than the first dimensions.

Figure 6:
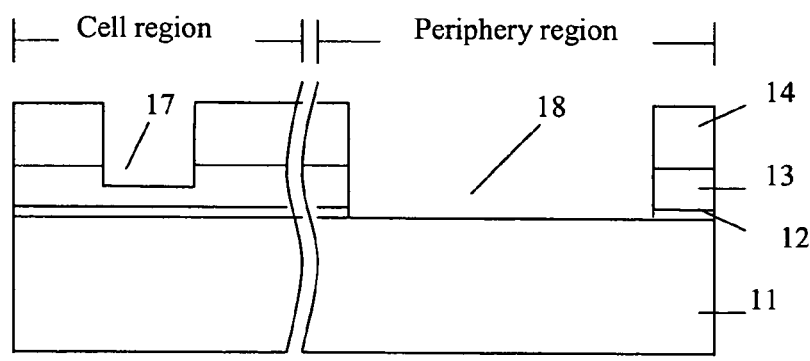
FIG. 6 is a cross-sectional view of the structure of FIG. 1 following removal of a portion of the exposed hard mask in the cell region and removal of substantially all of the exposed hard mask and pad oxide layer in the periphery region.

In FIG. 6, a cross-sectional view of a substrate 11 comprises a cell region and a periphery region as labeled in the drawing, a pad oxide layer 12 formed on the substrate 11, a hard mask layer 13 preferably comprising silicon nitride, and a patterned photoresist layer 14. In the illustrated embodiment, the FIG. 6 construction corresponds to that of FIG. 1 following removal by a first etching process of a portion of the exposed hard mask layer 13 in the cell region to from an etched portion 17 and removal of substantially all of the exposed hard mask layer 13 and pad oxide layer 12 in the periphery region to form an etched portion 18. Thus, in the periphery region etching is preferably performed all of the way down to the substrate 11. An etching gas of the first etching process preferably comprises $CF_4/CH_2F_2$ or $CF_4/CHF_3$. The ratio of $CF_4$ to $CH_2F_2$ is preferably about 2 about 5. The ratio of $CF_4$ to $CHF_3$ is preferably about 3 to about 5. Those skilled in the art will appreciate that other etching gases and other rations may likewise be suitable.

The comparatively small opening of the etched portion 17 facilitates the formation of a shallow trench isolation structure having a comparatively small critical dimension in the cell region, while the comparatively large opening of the etched portion 18 facilitates the formation of a shallow trench isolation structure having a comparatively large critical dimension in the periphery region. As will be seen from the following discussion, the shallow trench isolation structure in the periphery region will be formed to be deeper and larger than the shallow trench isolation structure in the cell region, so that the shallow trench isolation structure in the periphery region can for example inhibit leakage efficiently. At the same time, in accordance with an aspect of the present invention, the shallow trench isolation structure in the cell region will be formed to remain relatively small for optimal integration enhancement.

Figure 7:
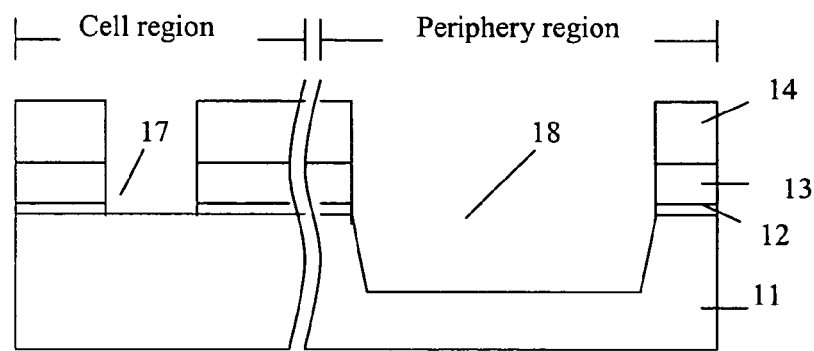
FIG. 7 is a cross-sectional view showing removal of the remainder of the exposed hard mask, as well as the pad oxide layer therebeneath, in the cell region and showing the beginning of the formation of a trench in the exposed substrate of the periphery region.

Referring now to FIG. 7, a second etching process is performed to remove the remaining hard mask in the cell region and optionally to begin forming a trench in the cell region. The second etching process also begins forming a trench in the periphery region. Preferably, the etched portion 17 in the cell region extends through the pad oxide layer 13 and the etched portion 18 of the periphery region extends substantially into the substrate 11 after the second etching process. In the second etching process, the etching rate of the hard mask layer 13 is smaller than the etching rate of the substrate 11. The etching selectivity between the substrate 11 and the hard mask layer 13 is thus chosen accordingly. In a preferred embodiment, the etching selectivity between the substrate 11 and the hard mask layer 13 is chosen to be larger than 5 (substrate to hard mask), and the etching recipe of the second etching process comprises $HBr/CF_4/Cl_2/He—O_2$.

Those skilled in the art will appreciate that other etching gases may likewise be suitable.

Figure 8:
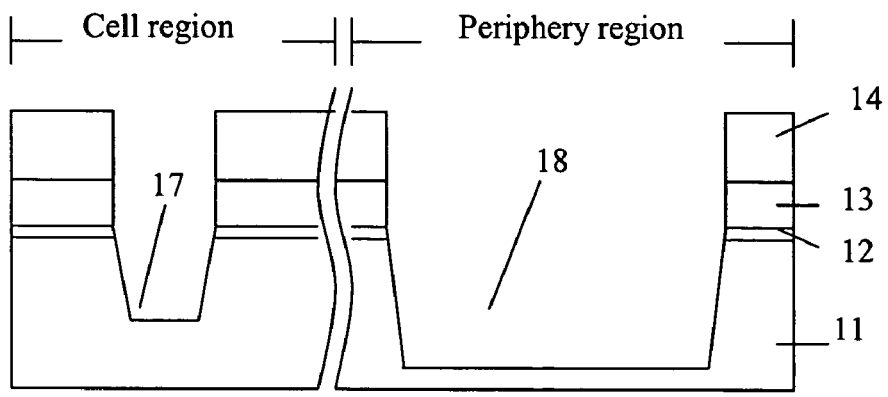
FIG. 8 is a cross-sectional view showing formation of a trench in the cell region of the substrate and showing completion of the formation of a trench in the substrate of the periphery region.

Referring now to FIG. 8, a third etching process is performed to form a trench 17 in the substrate 11 in the cell region thereof and to complete the trench 18 in the substrate 11 in the periphery region thereof. In accordance with the illustrated embodiment, the trench 18 in the periphery region is wider than the trench 17 in the cell region and/or is deeper than the trench 17 in the cell region. As presently embodied, the trench 18 in the periphery region can be about 1000 A deeper than the trench 17 in the cell region. In an exemplary embodiment, the trench 17 in the cell region has a depth of about 2000 A and the trench 18 in the periphery region has a depth of about 3000 A.

An etching gas of the third etching process preferably comprises $Cl_2/O_2$. The ratio of $Cl_2$ to $O_2$ is preferably about 6 to about 12, and the etching gas plasma can contain 60–120 sccm $Cl_2$ and 5–12 sccm $O_2$. Although those skilled in the art will appreciate that other etching gases may also be suitable.

Figure 9:
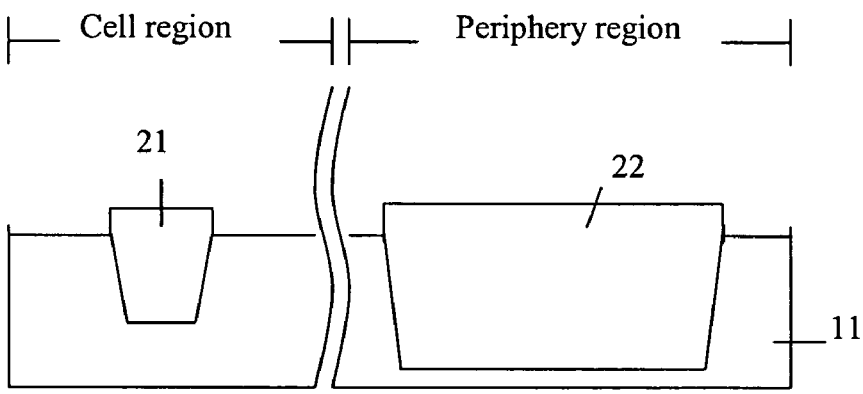
FIG. 9 is a cross-sectional view showing the trench of the cell region and the trench of the periphery region of FIG. 8 both filled with an insulating material.

Referring now to FIG. 9, the photoresist layer 14 is removed and an insulating material 21, 22, such as silicon dioxide, is deposited within the trenches 17, 18, so as to form shallow trench isolation structures. The second trench forming a shallow trench isolation region remains wider and deeper than the first trench which as shown also forms a shallow trench isolation region. After depositing the insulating material 21, 22 within the trenches 17, 18, the hard mask 14 and the optional pad oxide layer 12 are preferably removed. Shallow trench isolation corner rounding can be achieved by way of subsequently implemented thermal processes.

In view of the foregoing, it will be understood by those skilled in the art that the methods of the present invention can facilitate formation of shallow trench isolation structures having different dimensions according to different locations on a substrate. The above-described embodiments have been provided by way of example, and the present invention is not limited to these examples. Multiple variations and modifications to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method for forming shallow trench isolation structures, the method comprising:
providing a substrate having a cell region and a periphery region;
forming a hard mask upon the substrate so as to cover at least a portion of the cell region and at least a portion of the periphery region;
forming a patterned photoresist layer upon the hard mask, the photoresist layer exposing a portion of the hard mask in the cell region and exposing a portion of the hard mask in the periphery region;
performing a first etching process to remove substantially all of the hard mask layer exposed by the photoresist layer in the periphery region and to remove a portion of the hard mask layer exposed by the photoresist layer in the cell region;
performing a second etching process to partially form a trench in the periphery region and to remove more of the hard mask layer in the cell region;
performing a third etching process to deepen the trench formed in the periphery region and to form a trench in the cell region; and
filling the trench in the periphery region and filling the trench in the cell region with an insulating material.

2. The method as set forth in claim 1, wherein:
the second etching process partially forms a trench in the periphery region having rounded corners; and
the third etching process deepens the trench formed in the periphery region while maintaining the rounded corners thereof.

3. The method as set forth in claim 1, further comprising:
removing the photoresist after performing the third etching process; and removing the hard mask after filling the trench with an insulating material.

4. The method as set forth in claim 1, further comprising forming a pad oxide layer upon the substrate prior to forming the hard mask thereon.

5. The method as set forth in claim 1, wherein:
the method further comprises forming a pad oxide layer upon the substrate prior to forming the hard mask thereon;
the first etching process removes substantially all of the pad oxide layer exposed by the photoresist layer in the periphery region; and
the trench in the periphery region has a depth which is greater than a depth of the trench in the cell region.

6. The method as set forth in claim 5, wherein the trench in the periphery region has a width which is greater than a width of the trench in the cell region.

7. The method as set forth in claim 7, wherein:
the performing of a second etching process comprises using an etching gas with a selectivity between the substrate and the hard mask that is larger than about five (substrate to hard mask); and
the trench in the periphery region has a depth which is greater than a depth of the trench in the cell region following the third etching process.

8. The method as set forth in claim 1, wherein the hard mask layer comprises a silicon nitride layer.

9. The method as set forth in claim 1, wherein corners of the trench formed in the cell region are not substantially rounded.

10. The method as set forth in claim 1, wherein:
an etching gas of the first etching process comprises one of $CF_4/CH_2F_2$ and $CF_4CHF_3$;
a gas of the second etching process comprises $HBr/CF_4/Cl_2/He$—$O_2$; and
the trench in the periphery region has a depth which is greater than a depth of the trench in the cell region following the third etching process.

11. The method as set forth in claim 1, wherein:
an etching gas of the first etching process comprises one of $CF_4/CH_2F_2$ and $CF_4/CHF_3$; and
an etching gas of the second etching process comprises $CF_4/CHF_3$.

12. The method as set forth in claim 1, wherein an etching gas of the third etching process comprises $Cl_2/O_2$.

13. The method as set forth in claim 1, wherein filling the trench in the periphery region and filling the trench in the cell region comprise filling the trench in the periphery region and the trench in the cell region with an oxide during a single processing step.

14. A The method for forming shallow trench isolation structures as set forth in claim 1, wherein the performance of a third etching process comprises deepening the trench formed in the periphery region and forming a trench in the cell region so tat the trench in the periphery region has a depth which is greater than a depth of the trench in the cell region.

15. The method as set forth in claim 1, wherein the round corners of the trench formed in the periphery region have a radius between approximately 30 nm and approximately 60 nm.

16. The method as set forth in claim 1, wherein the round corners of the trench fanned in the periphery region have a radius of about 60 nm.

17. The method as set forth in claim 1, wherein the trench in the periphery region and the trench in the cell region are formed so as to have different depths.

18. A method for forming trenches for shallow trench isolation structures, the method comprising;
   etching a hard mask of a periphery region deeper than a hard mask of a cell region during a first etching process;
   etching the hard mask of the cell region further and etching the substrate of the periphery region so as to partially form a trench during a second etching process; and
   etching the substrate in the cell region so as to form a trench in the cell region and etching the substrate in the periphery region so as to deepen the trench formed therein during a third etching process.

19. The method as set forth in claim 18, wherein the partially formed trench is partially formed to have rounded corners.

20. The method as set forth in claim 18, wherein the trench in the periphery region is formed to be deeper than the trench in the cell region.

21. A method for forming trenches for shallow trench isolation structures, the method comprising:
   etching a hard mask of a periphery region approximately down to a pad oxide layer and etching a hard mask of a cell region less than down to a pad oxide layer so as to leave a remaining portion of the exposed hard mask of the cell region during a first etching process;
   etching the remaining portion of the exposed hard mask of the cell region approximately down to the pad oxide layer and etching the substrate of the periphery region so as to form a trench during a second etching process; and
   etching the substrate in the cell region so as to form a trench therein and etching the substrate in the periphery region so as to deepen the trench formed therein during a third etching process.

22. The method for forming trenches for shallow trench isolation structures as set forth in claim 21, wherein:
   the etching of the substrate in the cell region comprises forming a trench in the cell region that does not have rounded corners; and
   following the etching of the substrate in the periphery region the trench in the periphery region has rounded corners.

23. The method for forming trenches for shallow trench isolation structures as set forth in claim 21, wherein;
   the trench in the periphery region is formed to have rounded corners and to be deeper than the trench in the cell region; and
   the trench in the cell region is formed to have corners which are not as rounded as those of the trench in the periphery region.

* * * * *